United States Patent [19]
Dixon

[11] 3,965,436
[45] June 22, 1976

[54] COMPRESSOR AND EXPANDER CIRCUITS FOR COMPANDER SYSTEM

[75] Inventor: Robert P. Dixon, Rustburg, Va.

[73] Assignee: General Electric Company, Lynchburg, Va.

[22] Filed: June 20, 1975

[21] Appl. No.: 588,679

[52] U.S. Cl. .............................. 330/29; 328/171; 330/30 D; 330/136; 330/145; 333/14
[51] Int. Cl.² ................................................ H03G 7/06
[58] Field of Search ............. 333/14; 330/29, 30 D; 179/1 P, 1 VC; 307/264; 328/171

[56] References Cited
UNITED STATES PATENTS

| | | | |
|---|---|---|---|
| 3,303,428 | 2/1967 | Zentmaier et al. | 330/29 |
| 3,435,359 | 3/1969 | Sennhenn | 330/29 |
| 3,497,823 | 2/1970 | Kriss et al. | 330/29 |
| 3,624,491 | 11/1971 | Fidi et al. | 333/14 X |
| 3,731,215 | 5/1973 | Peil et al. | 330/29 |
| 3,757,254 | 9/1973 | Takahashi et al. | 333/14 |
| 3,805,177 | 4/1974 | Risley | 330/29 |

FOREIGN PATENTS OR APPLICATIONS

| | | | |
|---|---|---|---|
| 888,995 | 2/1962 | United Kingdom | 330/29 |

*Primary Examiner*—Paul L. Gensler
*Attorney, Agent, or Firm*—James J. Williams

[57] ABSTRACT

The compressor part of a compander uses a differential amplifier to receive voice signals. Diode attenuator circuits are connected to the differential amplifier output and attenuate the differential amplifier output signals as a function of a rectified signal derived from the compressor output. The expander part of the compander also uses a differential amplifier to receive voice signals. The differential amplifier is interconnected by a diode attenuator circuit which varies the gain of the differential amplifier as a function of a rectified signal derived from the expander input. The compander thus requires no inductors and uses components which are relatively small and compact.

8 Claims, 3 Drawing Figures

COMPRESSOR

EXPANDER

COMPRESSOR AND EXPANDER CIRCUITS FOR COMPANDER SYSTEM

BACKGROUND OF THE INVENTION

My invention relates to a compander circuit, and particularly to a compander circuit having a compressor and an expander that are relatively small and that do not require inductors.

Companders (contracted from COMpressor and exPANDER) are used in transmitting voice signals to improve the signal-to-noise ratio of such voice signals. The dynamic range of voice signals is compressed (by the compressor part of the compander) from 60 db to 30 db, so that the lower level voice signals are transmitted at a relatively higher power level. After being transmitted over a line system, the received lower level voice signals are considerably higher than the system noise levels. The received voice signals are then expanded (by the expander part of the compander) to restore the original 60 db dynamic range. Such companders have been utilized extensively, because of this improvement in the signal-to-noise ratio, particularly with respect to the low level voice signals. However, these advantages are offset to some extent by prior art companders which, as far as I am aware, required transformers and inductors. Such transformers and inductors are, of course, relatively large and expensive. Accordingly, a compander having no transformers or inductors would be very desirable. In addition, companders would be used more if they could be adapted to the relatively small electronic circuit techniques now being used.

Accordingly, a primary object of my invention is to provide a new and improved compressor and expander for a compander circuit.

A relatively specific object of my invention is to provide a new and improved compander circuit that requires no transformers and no inductors.

Another relatively specific object of my invention is to provide a new and improved compander circuit that is relatively small and compact, and hence can be used in the relatively small electronic circuits now frequently required.

SUMMARY OF THE INVENTION

Briefly, these and other objects are achieved in accordance with my invention by a compander whose compressor has a differential amplifier to which voice signals are applied. Diode attenuator circuits are connected to the differential amplifier outputs and attenuate the differential output signals as a function of a rectified signal derived from the compressor output signals. The expander part of the compander also has a differential amplifier to which voice signals are applied. The differential amplifier is interconnected by a diode attenuator circuit which varies the gain of the differential amplifier as a function of a rectified signal derived from the expander input signals. The compressor and expander thus provides a compander which requires no transformers or inductors, and which uses components that are relatively small and compact.

BRIEF DESCRIPTION OF THE DRAWING

The subject matter which I regard as my invention is particularly pointed out and distinctly claimed in the claims. The structure and operation of my invention, together with further objects and advantages, may be better understood from the following description given in connection with the accompanying drawing, in which:

DESCRIPTION OF A PREFERRED EMBODIMENT

Figure 1:
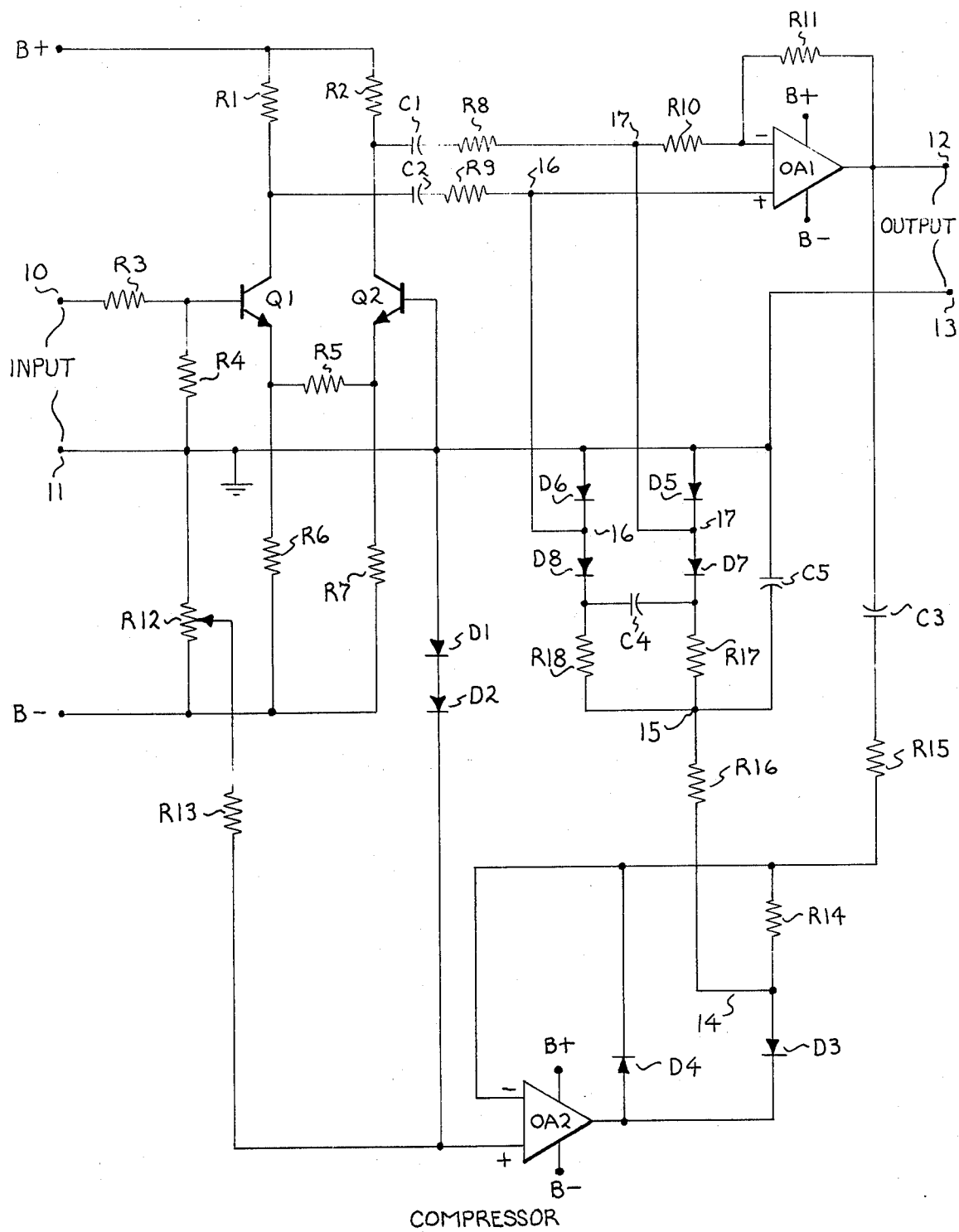
FIG. 1 shows a circuit diagram of a preferred embodiment of a compressor circuit in accordance with my invention and which forms part of a compander.

In a typical embodiment where a compander would be used, voice signals are transmitted over some line or system which is subject to noise or other interference. Before being transmitted, it is desirable that the dyanamic range of the voice signals be compressed so that voice signals of a lower level are transmitted at a relatively high level with respect to those voice signals of a high level. After being transmitted over the line or system, the received voice signals are expanded so as to restore the voice signals to their proper relative levels. FIG. 1 shows a circuit diagram of a preferred embodiment of my compressor. The voice signals to be compressed are applied to input terminals 10, 11. The terminal 11 is considered a common terminal and may be grounded as shown. Operating power for the compressor is provided at a B+ terminal and a B− terminal by suitable sources of direct current power that are positive and negative with respect to ground. The voice signals are applied to a differential amplifier comprising two NPN type transistors Q1, Q2. The input terminal 10 is connected to the base of the transistor Q1 through a resistor R3, and the input terminal 11 is connected directly to the base of the transistor Q2. A positive voltage is applied to the transistor collectors through respective resistors R1, R2, and a negative voltage is applied to the transistor emitters through respective resistors R6, R7. The emitters of the two transistors Q1, Q2 are connected together through a resistor R5 to form the differential amplifier. An output is derived from the transistor Q2 at its collector, and supplied through a capacitor C1, a resistor R8, and a resistor R10 to the negative input terminal of an operational amplifier OA1. Similarly, an output is derived from the collector of the transistor Q1 and applied through a capacitor C2 and a resistor R9 to the positive input terminal of the operational amplifier OA1. The amplifier OA1 is supplied with suitable direct current power at its indicated terminals B+ and B−. A feedback resistor R11 is also provided for the operational amplifier OA1. One output terminal 12 of the compressor is connected to the output of the operational amplifier OA1, and the other output terminal 13 of the compressor is connected to the input terminal 11. Signals at the terminals 12, 13 represent the combined output from the differential amplifier transistors Q1, Q2.

The output signals appearing at the output terminals 12, 13 are rectified in the negative-going direction. These rectified signals are applied to diode attenuator networks to provide variable attenuation at the outputs of the differential amplifier transistors Q1, Q2. These networks comprise two diodes D5, D7 and a resistor R17 connected in series between the common terminals 11, 13 and a terminal 15; two diodes D6, D8 and a resistor R18 connected in series between the common terminals 11, 13 and the terminal 15; and a smoothing capacitor C4. The compressor output signals are applied through a capacitor C3 and a resistor R15 to the negative input terminal of an operational amplifier OA2 which serves simply to amplify these output signals. A reference voltage for the positive input terminal of the amplifier OA2 is provided by a potentiometer R12 connected between the common terminal 11 and the B− terminal. Temperature compensation may be provided by diodes D1, D2 connected in series between the common terminal 11 and the positive input terminal of the amplifier OA2. The reference voltage is selected by the variable tap of the potentiometer R12 and coupled through a resistor R13 to the positive input terminal of the amplifier OA2. Suitable direct current power is supplied to the B+ and B− terminals of the amplifier OA2. A negative voltage rectifier diode D3 and a feedback resistor R14 are connected between the output and the negative input terminal of the amplifier OA2, and a positive clipping diode D4 is also connected between the output and the negative input terminal of the amplifier OA2. The negative rectified voltage representing the output signal magnitude is derived at a terminal 14 and filtered by a resistor R16 and a capacitor C5 connected between the terminal 14 and the common terminal 11. The filtered output is applied to the attenuator network terminal 15.

When the compressor is in operation, the current through the diodes D5, D7 determines the magnitude of the voltage supplied from the collector of the transistor Q2 to the negative input terminal of the operational amplifier OA1, and the current through the diodes D6, D8 determines the magnitude of the voltage supplied from the collector of the transistor Q1 to the positive input of the operational amplifier OA1. These current magnitudes are determined by the magnitude of the negative voltage at the terminal 14 and the terminal 15, and the magnitude of this negative voltage is determined by the magnitude of the output signals. As the magnitude of the output signals increases, the voltage at the terminal 14 increases in a negative direction so that more current flows from the common terminal 11 through the diodes D5, D7 and through the diodes D6, D8. This increased current reduces the impedances of the diodes D7, D8 so that reduced signal voltages from the differential amplifier transistors Q1, Q2 are applied to the operational amplifier OA1. These reduced signal voltages provide the compression desirable for high level signals. If the magnitude of the output signals has a lower level, the terminals 14, 15 become less negative so that the diodes D7, D8 conduct less current and appear as a higher impedance. As a result, increased signal voltages are applied to the input of the operational amplifier OA1. Thus, the outputs from the differential amplifier are attenuated as a function of the output signal level. Since diode impedances generally vary as the square of the diode currents, the change in the compressor output signal levels is one half of the change in the compressor input signal levels.

The compressor circuit of FIG. 1 has been constructed with components having the following values or characteristics:

| Component | Value or Characteristic |
|---|---|
| B+ | 12 volts |
| B− | 12 volts |
| R1 | 9,760 ohms |
| R2 | 9,760 ohms |
| R3 | 909 ohms |
| R4 | 301 ohms |
| R5 | 2,210 ohms |
| R6 | 24,000 ohms |
| R7 | 24,000 ohms |
| R8 | 47,500 ohms |
| R9 | 47,500 ohms |
| R10 | 97,600 ohms |
| R11 | 3.3 megohms |
| R12 | 10,000 ohms |
| R13 | 1 megohm |
| R14 | 301,000 ohms |
| R15 | 18,700 ohms |
| R16 | 3,650 ohms |
| R17 | 36,500 ohms |
| R18 | 36,500 ohms |
| C1 | 0.1 microfarad |
| C2 | 0.1 microfarad |
| C3 | 0.1 microfarad |
| C4 | 47 microfarads |
| C5 | 1.0 microfarad |
| D1 | Type 1N914 |
| D2 | Type 1N914 |
| D3 | Type 1N914 |
| D4 | Type 1N914 |
| D5 | Type 1N914 |
| D6 | Type 1N914 |
| D7 | Type 1N914 |
| D8 | Type 1N914 |
| Q1 | Type 2N3227 |
| Q2 | Type 2N3227 |
| OA1 | Type 741 |
| OA2 | Type 741 |

Figure 3:
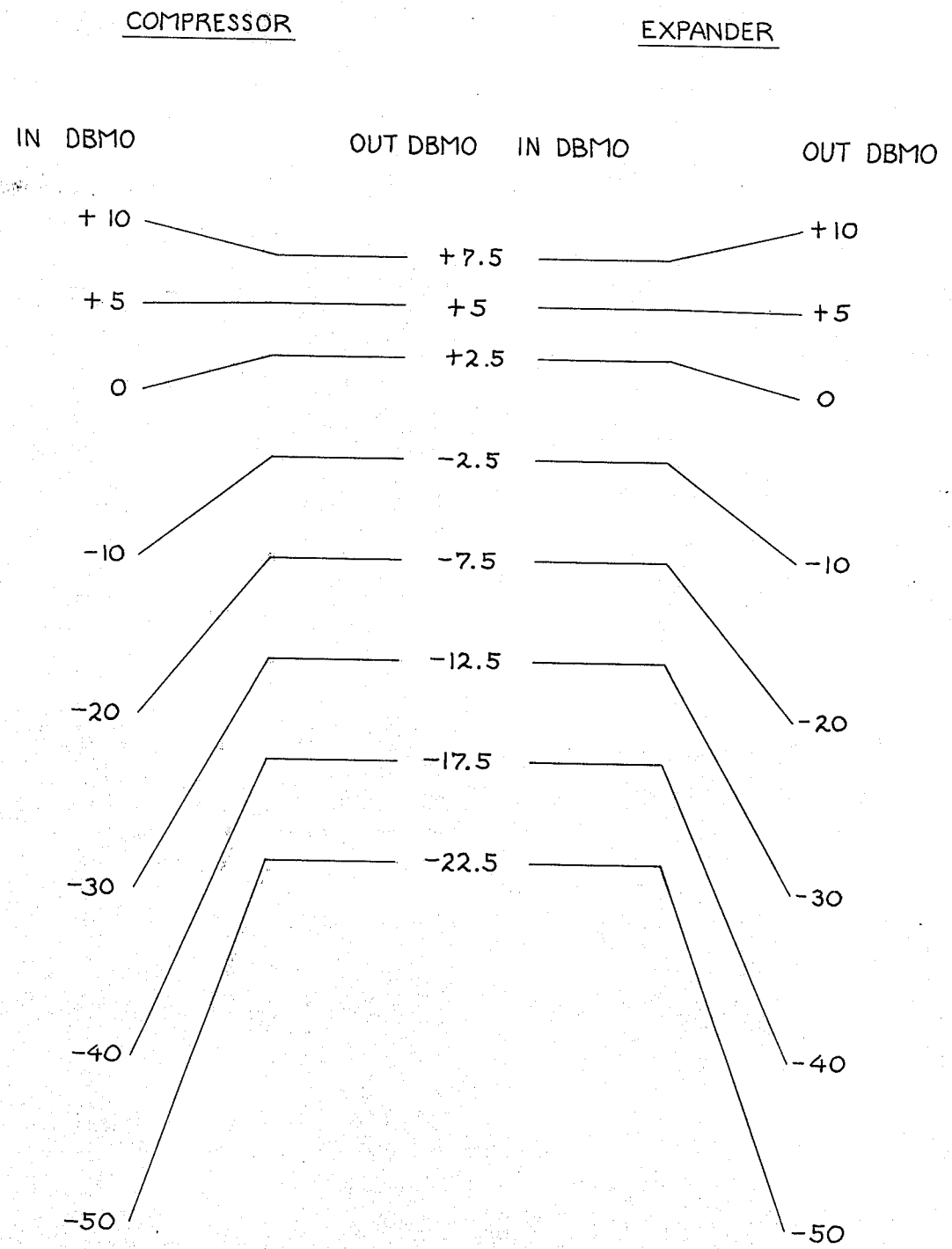
FIG. 3 shows a chart illustrating the operation of the compressor and expander circuits of FIGS. 1 and 2.

The operation of this compressor circuit is illustrated in the chart of FIG. 3 at the left under the legend compressor. At the left, it will be seen that input signals in DBMO are plotted from +10 downward through zero to −50. The lines for these signals are extended to the right and after going through the compressor, have an output level in DBMO of +7.5 down through −22.5 respectively. Thus, an input signal dynamic range of 60 db is compressed as indicated by the lines to an output dynamic range of 30 db. And, the particular input levels are compressed as illustrated. For example, a change in input level from +10 db to +5 db (5 db change) results in an output level change from +7.5 db to +5 db (2.5 db change). An input level change from −50 db to −30 db (20 db change) results in an output level change from −22.5 db to −12.5 db (10 db change). These and other examples show the compression to one half of the input change.

After the compressed signals are transmitted over a line or system, they must then be expanded to restore the normal dynamic range of levels. This is done by my expander circuit shown in FIG. 2. In my expander, the signals to be expanded are applied to input terminals 20, 21. A positive terminal B+ and a negative terminal B− provide the expander with suitable direct current power which is positive and negative with respect to ground. The input signals at the terminal 20 are applied through a resistor R23 to the base of an NPN type transistor Q11. The base of the transistor Q11 is connected to the terminal 21 by a resistor R24. The transistor Q11 and an NPN type transistor Q12 are connected as a differential amplifier. The base of the transistor Q12 is connected to the input terminal 21, which may be grounded as shown. The connection forming the differential amplifier comprises a diode D11 having its anode connected to the emitter of the transistor Q11, a capacitor C13 connected to the cathode of the diode D11, and a diode D12 connected between the capacitor C13 and the emitter of the transistor Q12. The diodes D11, D12 are poled in opposite directions, and serve as a variable attenuator circuit to vary the gain of the differential amplifier, and thereby provide expansion. The transistors Q11, Q12 are supplied with suitable operating voltages through resistors R21, R22 connected between their respective collectors and the B+ terminal, and resistors R25, R26 connected between their respective emitters and the B– terminal. The differential outputs from the transistors Q11, Q12 are derived at their collectors and applied through a capacitor C11 to the positive input of an operational amplifier OA11, and through a capacitor C12 and a resistor R30 to the negative input of the operational amplifier OA11. The amplifier OA11 is supplied with suitable direct current power at the terminals B+ and B–. A resistor R29 is connected from the positive input terminal to the terminal 21, and a feedback resistor R31 is connected from the output of the amplifier OA11 to the negative input terminal. Output signals are derived at an output terminal 22 connected to the amplifier OA11, and an output terminal 23 connected to the input terminal 21. These output signals are expanded as a function of their input magnitude by the variable attenuator circuit comprising the diodes D11, D12 as will be explained.

The impedance and the attenuation of the diodes D11, D12, and therefore the gain of the differential amplifier, is varied as a function of the input signal magnitude. This input signal is rectified and the negative rectified voltage is supplied at a terminal 24. As the input signal magnitude increases, the magnitude of this rectified voltage increases in a negative direction so that the diodes D11, D12 conduct more. This causes the diodes D11, D12 to have a lower impedance so that the interconnection circuit attenuates less, and thus provides greater amplification (or gain) in the differential amplifier. Conversely, as the input signal magnitude decreases, the magnitude of this rectified voltage becomes less negative so that the diodes D11, D12 conduct less. This causes the diodes D11, D12 to have a higher impedance so that the interconnection circuit attenuates more, and thus provides less amplification (or gain) in the differential amplifier. Since the diode impedances vary as the square of the diode currents, the change in the amplifier gain is twice the change in the compressor input signal levels. Thus, expansion by a factor of two is provided.

As described in connection with FIG. 1, an operational amplifier OA12 is provided to amplify the input signals which are used to provide a rectified negative-going control signal. Specifically, the input terminal 20 is connected through a capacitor C15 and a resistor R36 to the negative input terminal of the amplifier OA12. A negative reference voltage is provided for the positive input terminal of the amplifier OA12 by temperature compensating diodes D13, D14, and by a series circuit having a resistor R32, a potentiometer R33, a resistor R34, and a resistor R35. The lower end of the diode D14 and the resistor R34 are connected through a resistor R35 to the negative terminal B–. A tap on the potentiometer R33 provides a suitable voltage to the positive input terminal of the amplifier OA12. A positive clipping diode D16 is connected between the output and negative input terminal of the amplifier OA12. A rectifier circuit comprising the diode D15 and a resistor R37 are also connected between the output and negative input terminal of the amplifier OA12 to provide a half wave rectified, negative-going signal at a terminal 25. This signal is filtered by a resistor R38 and a capacitor C14 to provide the control signal at the terminal 24. This control signal has a negative magnitude which becomes more negative as the input signal magnitude increases, and which becomes less negative, (i.e., appraoches zero) as the input signal magnitude decreases. This variation in negative voltage controls the attenuator diodes D11, D12 and causes the differential amplifier gain to expand the input signals. These expanded input signals are combined in the amplifier OA11 and produced at the output terminals 22, 23.

Figure 2:
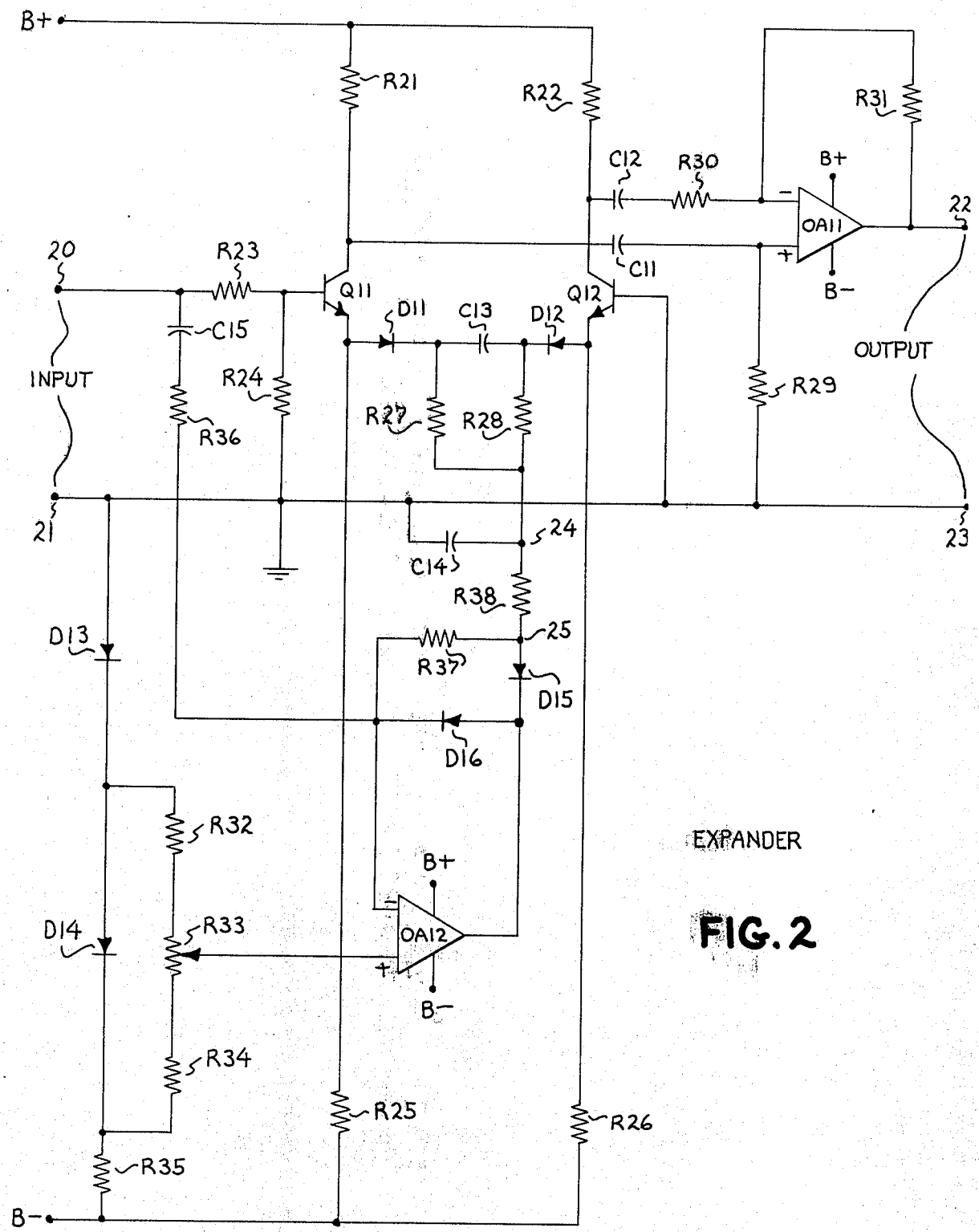
FIG. 2 shows a circuit diagram of a preferred embodiment of an expander circuit in accordance with my invention and which forms the other part of a compander.

The expander circuit of FIG. 2 has been constructed with components having the following values or characteristics.

| Component | Characteristic |
|---|---|
| B+ | 12 volts |
| B– | 12 volts |
| R21 | 6,190 ohms |
| R22 | 6,190 ohms |
| R23 | 1,180 ohms |
| R24 | 10 ohms |
| R25 | 97,600 ohms |
| R26 | 97,600 ohms |
| R27 | 51,100 ohms |
| R28 | 51,100 ohms |
| R29 | 97,600 ohms |
| R30 | 31,600 ohms |
| R31 | 1.1 megohms |
| R32 | 28,700 ohms |
| R33 | 25,000 ohms |
| R34 | 12,100 ohms |
| R35 | 14,700 ohms |
| R36 | 90,900 ohms |
| R37 | 301,000 ohms |
| R38 | 5,110 ohms |
| C11 | 0.1 microfarad |
| C12 | 0.1 microfarad |
| C13 | 15 microfarads |
| C14 | 1 microfarad |
| C15 | 0.1 microfarad |
| D11 | Type 1N914 |
| D12 | Type 1N914 |
| D13 | Type 1N914 |
| D14 | Type 1N914 |
| D15 | Type 1N914 |
| D16 | Type 1N914 |
| Q11 | Type 2N3227 |
| Q12 | Type 2N3227 |
| OA11 | Type 741 |
| OA12 | Type 741 |

The characteristics of this expander circuit are shown in the right hand portion of FIG. 3 under the legend expander. It will be seen that these characteristics are the reverse of the compressor characteristics, and serve to expand the input dynamic range between +7.5 and −22.5 db (30 db change) to an output dynamic range between +10 to −50 db (60 db change).

It will thus be seen that I provide a new and improved compander (or compressor and expander) for use with voice signals. My compander provides improved operation, and is particularly desirable in that it does not require transformers or inductors, and uses circuit components and elements which lend themselves to small or compact construction, sometimes referred to as microelectronic circuits. While I have shown only one embodiment of my compressor and one embodiment of my expander, persons skilled in the art will appreciate that modifications may be made. For example, it might be possible to eliminate amplifiers OA2 in FIG. 1 and OA12 in FIG. 2 if the output and input signals have sufficient magnitude to provide the necessary rectified direct current voltage. However, I prefer to use amplifiers for these signals, as they increase the sensitivity and effectiveness of my compander. Therefore, while my invention has been described with reference to particular embodiments, it is to be understood that modifications may be made without departing from the spirit of the invention or from the scope of the claims.

What I claim as new and desire to secure by Letters Patent of the United States is:

1. An improved compressor circuit for reducing the dynamic range of voice signals comprising:
   a. a main input for receiving said voice signals;
   b. a differential amplifier having an input and first and second differential outputs;
   c. means connecting said input of said differential amplifier to said main input;
   d. output means having first and second inputs and a common output;
   e. means connecting said first and second inputs of said output means to said first and second outputs of said differential amplifier respectively;
   f. first and second diode attenuator circuits each having an attenuating terminal and a control terminal;
   g. means connecting said attenuating terminals of said first and second diode attenuator circuits to said first and second outputs of said differential amplifier respectively;
   h. and means connecting said common output of said output means to said control terminals of said first and second attenuator circuits for causing said attenuator circuits to attenuate the signals at said first and second outputs of said differential amplifier as a function of the magnitude of the signals at said common output of said output means.

2. The improved compressor circuit of claim 1 wherein said means connecting said common output of said output means to said control terminals of said first and second attenuator circuits comprises a rectifier circuit which produces an output that increases in a negative direction as said magnitude of said signals at said common output of said output means increases, and thereby causes said attenuator circuits to attenuate more as said magnitude of said signals at said common output of said output means increases.

3. An improved expander circuit for increasing the dynamic range of voice signals comprising:
   a. a main input for receiving said voice signals;
   b. a differential amplifier having an input and first and second differential outputs, said differential amplifier being interconnected by a diode attenuator circuit having a control terminal;
   c. means connecting said input of said differential amplifier to said main input;
   d. a main output for providing expanded voice signals;
   e. means connecting said main output to said first and second outputs of said differential amplifier;
   f. and means connecting said main input to said control terminal of said attenuator circuit for causing said attenuator circuit to vary the gain of said differential amplifier as a function of the magnitude of said signals at said main input.

4. The improved expander circuit of claim 3 wherein said means connecting said main input to said control terminal of said attenuator circuit comprises a rectifier circuit which produces an output that increases in a negative direction as said magnitude of said signals at said main input increases, and thereby causes said attenuator circuit to increase the gain of said differential amplifier as said magnitude of said signals at said main input increases.

5. An improved compressor circuit for reducing the dynamic range of voice signals comprising:
   a. first and second input terminals for receiving said voice signals;
   b. first and second transistors each having an emitter-collector path and a base;
   c. means connecting said base of said first transistor to said first input terminal and said base of said second transistor to said second input terminal respectively;
   d. means connected between first corresponding ends of each of said emitter-collector paths of said first and second transistors to form a differential amplifier;
   e. an output terminal;
   f. means connected between second corresponding ends of each of said emitter-collector paths of said first and second transistors and said output terminal to supply output signals to said output terminal;
   g. rectifier means connected to said output terminal for producing a rectified control signal that increases in a selected polarity direction as a function of the magnitude of said output signals at said output terminal;
   h. and first and second diode attenuator circuits connected between said rectifier means and said second corresponding ends of each of said emitter-collector paths of said first and second transistors respectively for attenuating the signals at said second corresponding ends as a function of the magnitude of said rectified control signal.

6. The improved compressor circuit of claim 5 wherein said first and second diode attenuator circuits each comprise two diodes connected in series between said second input terminal and said rectifier means, and a connection between each junction of said two serially connected diodes and one of said second corresponding ends respectively.

7. An improved expander circuit for increasing the dynamic range of voice signals comprising:
   a. first and second input terminals for receiving voice signals;
   b. first and second transistors each having an emitter-collector path and a base;
   c. means connecting said base of said first transistor to said first input terminal and said base of said second transistor to said second input terminal respectively;
   d. a diode attenuator circuit connected between first corresponding ends of each of said emitter-collector paths of said first and second transistors to form a differential amplifier;
   e. an output terminal;
   f. means connected between second corresponding ends of each of said emitter-collector paths of said first and second transistors and said output terminal to supply output signals to said output terminal;

g. rectifier means connected to said input terminals for producing a control signal that increases in a selected polarity direction as a function of the magnitude of said voice signals at said input terminals;

h. and means connected between said rectifier means and said attenuator circuit for causing said differential amplifier to amplify signals as a function of the magnitude of said control signal.

8. The improved expander circuit of claim 7 wherein said diode attenuator circuit comprises a series circuit having a first diode poled in one direction and having one end connected to said first corresponding end of said first transistor, a capacitor having one end connected to the other end of said first diode, and a second diode poled in the opposite direction relative to said first diode and connected between the other end of said capacitor and said first corresponding end of said second transistor.

* * * * *